US005762084A

United States Patent [19]
Krusell et al.

[11] Patent Number: 5,762,084
[45] Date of Patent: Jun. 9, 1998

[54] MEGASONIC BATH

[75] Inventors: Wilbur C. Krusell, San Jose; David L. Thrasher, Santa Clara; Lynn S. Ryle, San Jose, all of Calif.

[73] Assignee: Ontrak Systems, Inc., San Jose, Calif.

[21] Appl. No.: 770,913

[22] Filed: Dec. 20, 1996

Related U.S. Application Data

[63] Continuation of Ser. No. 275,968, Jul. 15, 1994, abandoned.

[51] Int. Cl.⁶ ......................................................... B08B 3/10
[52] U.S. Cl. ............................................ 134/184; 134/902
[58] Field of Search .............................. 134/61, 902, 184, 134/68, 76, 148, 1, 1.3, 185, 180

[56] References Cited

U.S. PATENT DOCUMENTS

| | | | |
|---|---|---|---|
| 2,860,646 | 11/1958 | Zucker | 134/185 |
| 3,645,581 | 2/1972 | Lasch, Jr. et al. | 302/2 |
| 4,062,463 | 12/1977 | Hillman et al. | 214/301 |
| 4,193,218 | 3/1980 | Young et al. | 134/184 |
| 4,313,266 | 2/1982 | Tam | 34/8 |
| 4,677,758 | 7/1987 | Aigo | 34/58 |
| 4,826,538 | 5/1989 | Sander et al. | 134/1 |
| 4,902,350 | 2/1990 | Steck | 134/1 |
| 4,923,054 | 5/1990 | Ohtani et al. | 187/25 |
| 4,979,994 | 12/1990 | Dussault et al. | 134/902 |
| 4,989,345 | 2/1991 | Gill, Jr. | 34/58 |
| 5,017,239 | 5/1991 | Moxness et al. | 134/902 X |
| 5,071,776 | 12/1991 | Matsushita et al. | 134/1 |
| 5,081,733 | 1/1992 | Kudo | 15/77 |
| 5,088,510 | 2/1992 | Bannon | 134/902 |
| 5,108,513 | 4/1992 | Muller et al. | 134/15 |
| 5,144,494 | 9/1992 | Remec | 134/184 |
| 5,213,451 | 5/1993 | Frank et al. | 406/72 |
| 5,218,980 | 6/1993 | Evans | 134/600 |
| 5,279,316 | 1/1994 | Miranda | 134/902 |
| 5,289,838 | 3/1994 | Odell | 134/184 |
| 5,442,828 | 8/1995 | Lutz | 15/88.3 |

FOREIGN PATENT DOCUMENTS

| | | | |
|---|---|---|---|
| 8505758 | 12/1985 | European Pat. Off. | |
| 52-5975 | 1/1977 | Japan | 134/184 |
| 54-103265 | 8/1979 | Japan | 134/184 |
| 54-103269 | 8/1979 | Japan | 134/184 |
| 1-3000524 | 12/1989 | Japan | 134/184 |
| 4-207030 | 7/1992 | Japan | 134/902 |
| 5-13400 | 1/1993 | Japan | 134/902 |
| 5-15860 | 1/1993 | Japan | 134/184 |
| 5-102119 | 4/1993 | Japan | . |
| 5-144795 | 6/1993 | Japan | 134/902 |
| 662107 | 5/1979 | Russian Federation | 134/184 |
| 827807 | 2/1960 | United Kingdom | 134/1 |

*Primary Examiner*—Frankie L. Stinson
*Attorney, Agent, or Firm*—Blakely, Sokoloff, Taylor & Zafman LLP

[57] ABSTRACT

A megasonic bath with horizontal wafer orientation that may be conveniently interfaced with brush scrub systems. The megasonic transducer creates a sonic energy flow in the direction of the wafers. The sonic energy causes cavitation which loosens and displaces particles from the surface of the wafers. Water jets produce a horizontal flow across the wafer surfaces. The horizontal flow created by the water jets keeps the wafer surfaces wet, exposes the surfaces to fresh chemicals, and removes the particles which have been displaced or loosened by the sonic energy.

25 Claims, 3 Drawing Sheets

Megasonic Sender (Prior Art)

100

MEGASONIC BATH

This is a continuation of application Ser. No. 08/275,968, filed Jul. 15, 1994, now abandoned.

BACKGROUND OF THE INVENTION

1. Field of the Invention

This invention relates to methods of processing a substrate, and more specifically, to an apparatus for cleaning semiconductor wafers.

2. Prior Art

In the manufacture of semiconductor devices, the surface of semiconductor wafers must be cleaned of wafer contaminants. If not removed, wafer contaminants may affect device performance characteristics and may cause device failure to occur at faster rates than usual.

In general, there are two types of wafer contamination: particulates and films. Particulates are any bits of material present on a wafer surface that have readily definable boundaries, for example, silicon dust, atmospheric dust, plastic particles, and silicate particles. Films are layers of foreign material on wafer surfaces, for example, metallic films, photoresist residues, and solvent residues. It should be noted that films may break loose and become particles, for example, surface metals.

As there are two types of wafer contamination there are also separate cleaning procedures to remove each of them. Film contaminants are generally removed by chemical cleaning processes and particulates are generally removed by ultrasonic scrubbing or a combination of high pressure spraying and mechanical scrubbing.

The most commonly used chemical cleaning process is the RCA method. The RCA method is used for cleaning bare silicon or silicon wafers which only have thermally grown oxides. This process consists of six steps. First, there is a preliminary cleaning of the wafer. The wafer is immersed in a sulfuric acid-oxidant mixture (such as $H_2SO_4$—$H_2O_2$) which removes the photoresist present on the wafer. Often, even if the resist has previously been stripped, the wafer is immersed a second time into a sulfuric acid-oxidant mixture to prepare the wafer surface for the next step in the process. When the wafers are removed from the sulfuric-oxidant mixture they are then rinsed in 18°–23° C. deionized and filtered water. Such water is also used for all other rinse steps of the RCA method.

The second step of the RCA method is the removal of residual organic contaminants and certain metals. A fresh mixture of water, ammonium hydroxide, and hydrogen peroxide ($H_2O$—$NH_4OH$—$H_2O_2$, 5:1:1 by volume) is prepared and heated to approximately 75°–80° C. The wafers are then submersed into the solution for approximately 10–15 minutes, while the temperature is maintained at approximately 80° C. The wafers are then rinsed for approximately 1 minute in deionized water.

If a thermally grown silicon dioxide film does not completely cover the wafer, then the third step of the RCA method comprises stripping of the hydrous oxide film formed in step two. The wafers are submersed into a mixture of hydrofluoric acid and water (HF—$H_2O$, 1:10 by volume). Following immersion in the hydrofluoric acid, the wafers are rinsed, but only for 20–30 seconds. The short rinse minimizes re growth of the oxide.

The fourth step of the RCA method is desorption of the remaining atomic and ionic contaminants. A fresh mixture of water, hydrochloric acid, and hydrogen peroxide ($H_2O$—HCl—$H_2O_2$, 6:1:1 by volume) is prepared and heated to approximately 75°–80° C. The wafers are submerged into the solution for 10–15 minutes and are then rinsed in deionized water.

Steps five and six comprise drying and storing the wafers, respectively. It should be noted that in all the steps previous to drying, the wafers are kept wet in between each of the steps.

One method for removal of insoluble particulate contamination is Ultrasonic Scrubbing. In ultrasonic scrubbing wafers are placed in a horizontal cassette such that the wafers are vertical. The cassette is then immersed in a suitable liquid medium to which sonic energy in the range of 20,000 to 50,000 Hz is applied. Cavitation, the rapid forming and collapsing of microscopic bubbles in the liquid medium under the pressure of the sonic agitation, produces shock waves which impinge on wafer surfaces. The shock waves displace and loosen particulate matter. Since the wafers are vertically oriented the displaced particulate matter falls in between the wafers where gravity then pulls the particulate matter to the bottom of the scrubber. An improvement upon ultrasonic scrubbing is the Megasonic bath.

The megasonic bath incorporates the same principles as ultrasonic scrubbing, however, the megasonic bath uses higher frequency sonic waves, approximately 850 kHz. Also, the megasonic bath may be operated with the same solutions used in the RCA chemical film removal process. The use of the RCA solutions in the megasonic bath allows chemical cleaning and contaminant desorption while simultaneously removing particulates. If the RCA chemical solutions are used in the megasonic bath the chemicals are added above the wafers. Since the wafers are vertically oriented gravity pulls the chemicals down to the bottom of the cassette, thus treating all the wafer surfaces.

As with all cleaning processes, ultrasonic scrubbing and the megasonic bath have problems associated with them. One problem, is the need to prevent shock waves from carrying the particles and redepositing them on the wafer surfaces once they become detached and fall into the liquid medium. Currently, to remedy this problem particles are removed through overflow or filtration. A second problem associated with ultrasonic scrubbing and the megasonic bath is mechanical failure of the substrate film as a result of the ultrasonic energy imparted during the cleaning cycle. Frequently, mechanical failure of the substrate film results in film loss in certain regions, or in the extreme, the entire film may be removed. Another problem with ultrasonic scrubbing and the megasonic bath is that more metals may be deposited on the substrate surface than are removed, if the liquid medium contains ammonium hydroxide. A further problem associated with ultrasonic scrubbing and the megasonic bath is that the apparatus holds the wafers in a vertical position such that there is no convenient way to couple the apparatus to other systems. Currently, the wafers are removed from the horizontal cassette (i.e. the wafers are vertically oriented) of the megasonic bath and placed into a vertical cassette (i.e. the wafers are horizontally oriented) by a robotic arm. The robotic arm lifts the wafers out of the liquid medium of the megasonic bath, thus subjecting the wafers to further contamination, and then places the wafers into the vertical cassette of the scrubber.

What is needed is a megasonic bath that may be conveniently coupled to other systems, such as the double sided scrub system used in semiconductor wafer cleaning.

SUMMARY OF THE INVENTION

The present invention describes a megasonic bath with horizontal wafer orientation that may be conveniently coupled to other systems.

The present invention describes a megasonic bath wherein the wafer cassette is vertically oriented thus holding the wafers in a horizontal position. A megasonic transducer is oriented in the same vertical position as the wafer cassette. The megasonic transducer produces a sonic energy flow in the direction of the wafers. The sonic energy causes particulates to be displaced and loosened from the wafer surface. A number of water jets are stacked vertically on the opposite side of the megasonic bath from the megasonic transducer. The water jets spray in the same horizontal direction as the wafers but in the opposite direction of the sonic energy flow. The water jets remove the particulates that have been displaced or loosened from the wafer surface, thus leaving the wafers clean.

Additional features and benefits of the present invention will become apparent from the detailed description, figures, and claims set forth below.

BRIEF DESCRIPTION OF THE DRAWINGS

The present invention is illustrated by way of example and not limitation in the accompanying figures and in which.

DETAILED DESCRIPTION

A megasonic bath is disclosed. In the following description, numerous specific details are set forth such as specific materials, dimensions, etc. in order to provide a thorough understanding of the present invention. It will be obvious, however, to one skilled in the art that these specific details need not be employed to practice the present invention. In other instances, well known materials or methods have not been described in detail in order to avoid unnecessarily obscuring the present invention.

In the following description, a megasonic bath with a vertical wafer cassette is described. The use of a vertical wafer cassette allows the present invention to be conveniently coupled to (or placed in line with) other processing systems such as a scrubber, wherein both sides of a wafer are scrubbed. It will be obvious to one with skill in the art that the present invention may also be placed in line with other processing systems such as a chemical mechanical polisher, a scrubber, wherein only one side of a wafer is scrubbed, etc. Vertical orientation of the wafer cassette allows the wafers to be transferred from the megasonic bath into processing systems without the use of a robotic arm and without removing the wafers from the liquid medium of the megasonic bath. It should be noted that the term interface is being used to describe the ability of two systems to be connected (or joined) such that they may become one larger system. In other words, the megasonic bath (described herein) may be structurally connected to a processing system such that the wafers may be transferred from the megasonic bath and into the processing system, or vice versa, without the use of a robotic arm. It should also be noted that although the present invention described in conjunction with the scrubbing of a wafer, it will be appreciated that any similarly shaped, i.e. generally flat substrate, may be processed by the methods and apparatus of the present invention. Further, it will be appreciated that reference to a wafer or substrate may include a bare or pure semiconductor substrate, with or without doping, a semiconductor substrate with epitaxial layers, a semiconductor substrate incorporating one or more device layers at any stage of processing, other types of substrates incorporating one or more semiconductor layers such as substrates having semiconductor on insulator (SOI) devices, or substrates for processing other apparati and devices such as flat panel displays, multichip modules, etc.

Figure 1:
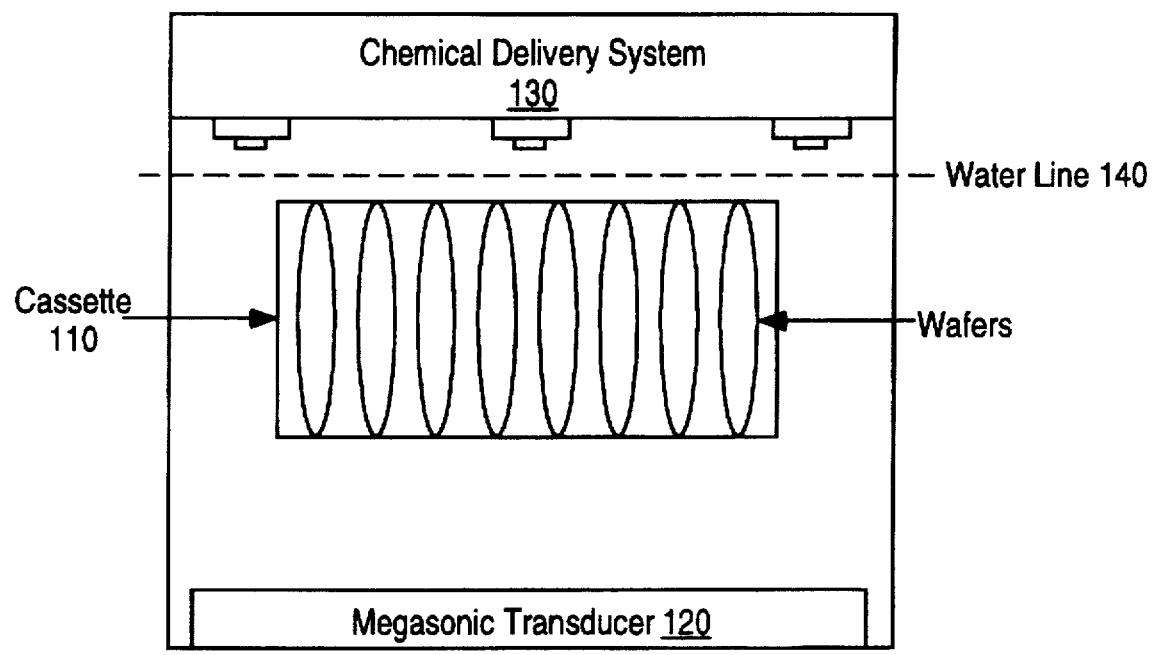
FIG. 1 illustrates a prior art megasonic bath.

FIG. 1 represents the prior art megasonic bath (bath) 100. In FIG. 1 the wafer cassette (cassette) 110 is oriented in a horizontal position. The horizontal orientation of the cassette 110 causes the wafers to be oriented in a vertical position. The megasonic transducer (transducer) 120 is oriented in a horizontal position under the cassette 110. When the transducer 120 is turned on it creates a sonic energy flow, with a frequency of approximately 850 kHz, through the liquid medium of the bath 100. The sonic energy flow moves in a vertical direction toward the wafers. The sonic energy causes cavitation. Cavitation is the rapid forming and collapsing of microscopic bubbles in the liquid medium of the bath under the pressure of sonic agitation. Cavitation produces shock waves which impinge on the wafer surfaces. The shock waves produced by cavitation displace and loosen particulate matter from the surface of the wafers. Due to the vertical orientation of the wafers the displaced and loosened particulate matter fall between the wafers and are pulled by gravity to the bottom of the bath 100. Microscopic bubbles which are created but not collapsed by the sonic energy float between the wafers to the top of the liquid medium and burst at the water line 140. Chemical delivery system 130 may be used to add chemicals to the liquid medium of the bath 100. For example, if one wants to use the RCA chemical film removal process in conjunction with the bath 100 the chemical solutions of the RCA process are added to the liquid medium of the bath through the chemical delivery system 130. The chemical delivery system 130 adds the chemical solutions above the wafers. Gravity pulls the chemicals down between the wafers. Since the wafers are vertically oriented, as gravity pulls the chemicals down to the bottom of the cassette 110, all the wafer surfaces are treated with the chemicals. Thus the megasonic bath 100 may be used for chemical cleaning and contaminant desorption while simultaneously removing particulates.

The problem with the prior art megasonic bath (shown in FIG. 1) is that the apparatus holds the wafers in a vertical position such that there is no convenient way to place the apparatus in line with other processing systems.

Figure 2:
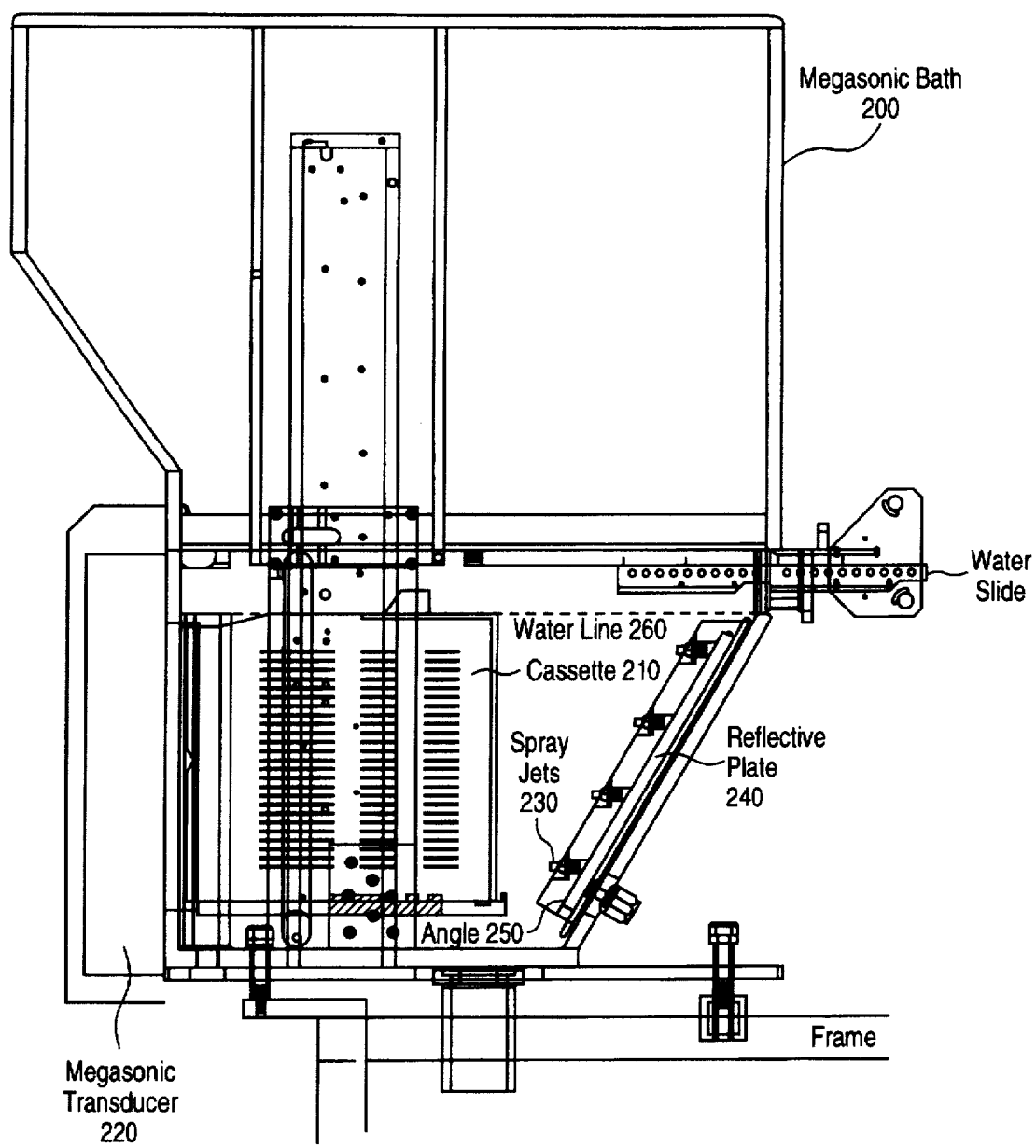
FIG. 2 illustrates a preferred embodiment of the present invention.

FIG. 2 represents a currently preferred embodiment of the present invention, comprising a megasonic bath with a vertically oriented cassette (bath) 200. In FIG. 2 the wafer cassette (cassette) 210 is oriented in a vertical position. The vertical orientation of the cassette causes the wafers to be oriented in a horizontal position. The megasonic transducer (transducer) 220, of the present invention, is oriented in a vertical position to the side of the cassette 210. When the transducer 220 is turned on it creates a sonic energy flow, with a frequency of approximately 850 kHz, through the liquid medium of the bath 200. The sonic energy flow moves in a horizontal direction toward the wafers. The sonic energy causes cavitation, the rapid forming and collapsing of microscopic bubbles under the pressure of sonic agitation. Cavitation produces shock waves which impinge on wafer surfaces and cause particulate matter to be displaced and loosened from the wafer surfaces. Thus, the megasonic bath 200 removes particulate matter in a similar manner to the prior art megasonic bath 100, in FIG. 1.

The present invention may also incorporate one or more improvements, such as spray jets 230, reflective place 240, and/or angle 250 as shown in FIG. 2. The spray jets 230 are stacked in the same vertical manner as the wafers and are positioned on the opposite wall of the bath 200 from the transducer 220, as shown in FIG. 2. Jets 230 are positioned such that they spray in a horizontal direction at the wafers but in the opposite direction of the sonic energy flow. In other words, jets 230 create a horizontal flow of the liquid medium opposite the sonic energy flow.

The jets 230 essentially perform the same functions as gravity in the prior art bath 100. First, the jets 230 flush bubbles from the wafer surfaces allowing access of fresh chemicals and sonic energy to these surfaces. The jets 230 remove the displaced and loosened particulate matter from in between the wafers and keep the particles from being redeposited. In addition, the jets 230 aid in the mixing of chemical reagents and surfactants added to the liquid medium, such as the chemical solutions used in the RCA process, thus treating all the wafer surfaces. Constant mixing of the chemicals facilitates cleaning and evenly distributes recirculated chemical reagents. Jets 230 also keep the wafers from traveling in the direction of propagation of the sonic energy, thereby keeping the wafer edges from being damaged.

Reflective plate (plate) 240 and Angle 250, work in conjunction to improve the megasonic bath. Plate 240 is made of a material such that the chemical solutions associated with a megasonic bath will not eat through the plate 240. In a currently preferred embodiment plate 240 is made up of a material comprising quartz. Plate 240 is mounted at angle 250, and is located on the opposite side of megasonic bath 200 from transducer 220. The plate 240 is situated such that the angle 250 between the bottom of bath 200 and the surface of plate 240 is approximately 115°–135° (i.e. 25°–45° from the vertical). In a currently preferred embodiment plate 240 is situated at an angle 240 of approximately 120° (i.e. 30° from the vertical) so that it reflects the sonic energy flow straight up (at an angle of 90°) to the surface of the liquid medium.

The reflective plate 240 and angle 250 reflect the sonic energy up toward the surface of the liquid medium, thereby minimizing any back reflection or standing wave effects. Back reflection may cause the nodes of the sonic energy waves to be canceled out and the anti-nodes of the sonic energy waves to be reinforced. In other words, the amplitude of the anti-node may be increased and the amplitude at the node may become zero. Such an effect caused by back reflection may cause an inconsistent cleaning pattern on the wafer. Back reflection may also cause standing waves which may interfere with the flushing of the solution. Also, using the plate 240 at the appropriate angle 250 will minimize the amount of chemicals hitting the wall of the bath 200 thus preventing the chemical from eating through the wall of the bath 200.

Figure 3:
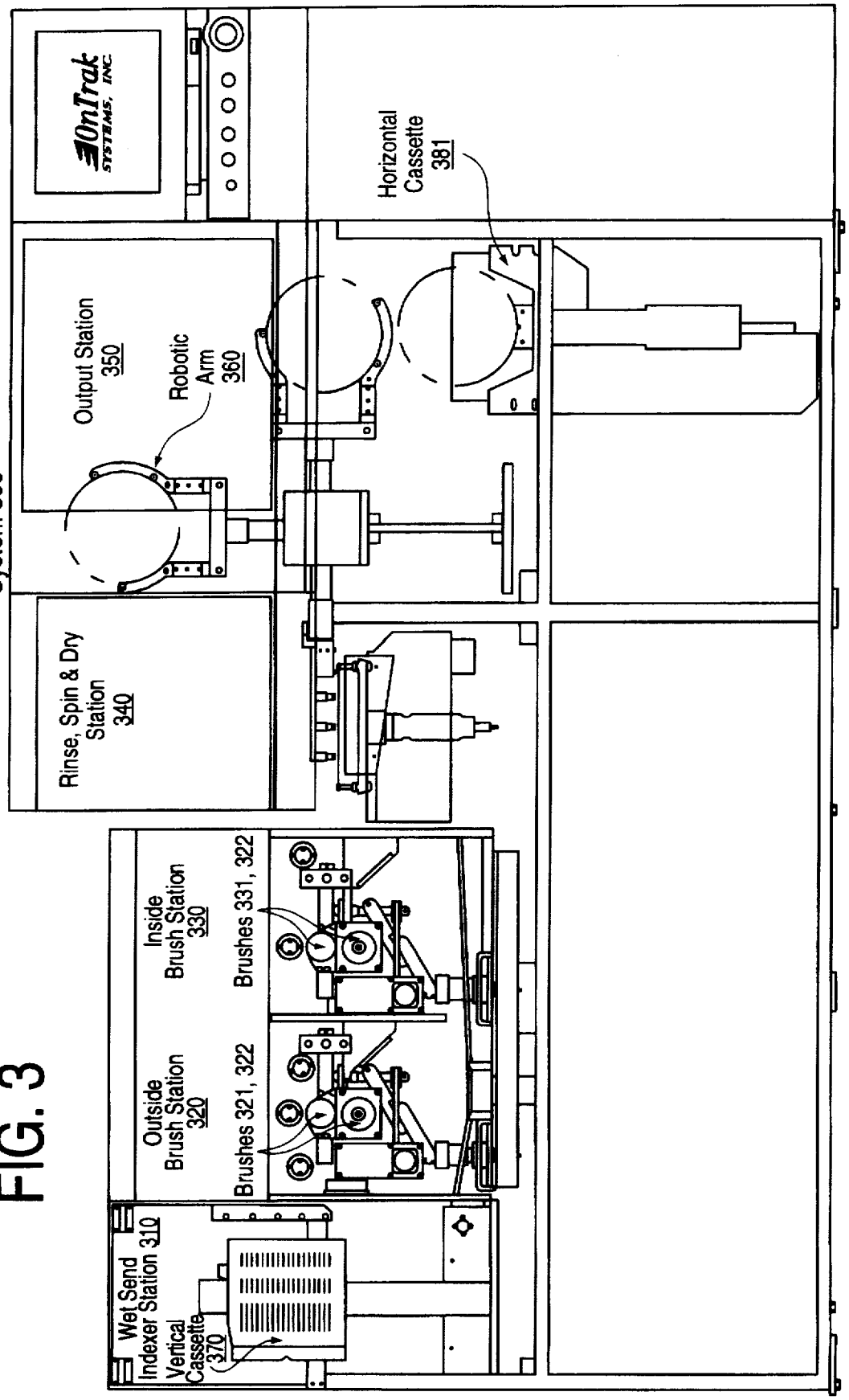
FIG. 3 illustrates a scrubber system, wherein both sides of a wafer are scrubbed.

FIG. 3 illustrates a double sided scrub system. An example of a scrubber of this type is the DSS-200™ scrubber, wherein both sides of a wafer are scrubbed available from On Track Systems, Inc. of Milpitas, Calif. The scrubber system, wherein both sides of a wafer are scrubbed (scrubber) 300 includes a number of stations. Each of these stations represent one or more steps in the wafer cleaning process.

Dirty wafers are loaded at one end of the scrubber 300 and clean wafers are unloaded from the other end of the scrubber 300. Dirty wafers are loaded into cassette 370. Cassette 370 is then loaded into wet send indexer station (indexer) 310. Cassette 370 is vertically oriented in indexer 310 such that the wafers will be horizontal.

In indexer 310, the surface state of the wafers is changed from hydrophobic to hydrophilic. To change the surface state of the wafers the process described in the copending patent application entitled, "Method to Remove Metals In A Scrubber" by Wilbur C. Krusell, filed on even date herewith, may be used. Once the surface state of the wafers have been changed to hydrophilic the wafers are then automatically removed from the cassette 370 and placed, one at a time, into the outside brush station 320. When a wafer is ready to be transferred to outside brush station 320, the cassette 370 is raised out of the indexer solution until the wafer to be transferred is in line with the conveyor belt that transfers the wafer into the outside brush station. Once the wafer and conveyor belt are aligned then the wafer is pushed out of cassette 370 and onto the conveyor belt which moves the wafer into the outside brush station 320. After the wafer is transferred, cassette 370 lowers back into the indexer solution. It should be noted that it will be clear to one with ordinary skill in the art that other methods and apparatus may be used when transferring the wafer from the indexer 310 to outside brush station 320, such as a water slide instead of a conveyor belt. It should also be noted that the wafer remains horizontally oriented during this transfer.

In the outside brush station 320, the wafer is processed through a first scrub. The wafer is brushed and sprayed to remove some of the particles from the wafer. Brushes 321 and 322 scrub both sides of the wafer. After the wafer has been processed through the first scrub the wafer is then automatically transferred to inside brush station 330.

In the inside brush station 330 the wafer is processed through a second scrub. The wafer is brushed and sprayed to remove more of the particles from the wafer. Brushes 331 and 332 scrub both sides of the wafer. After the second scrub the wafer is then automatically transferred to rinse, spin, and dry station 340.

Rinse, spin, and dry station 340 rinses, spins, and dries the wafer. The wafer is then removed from the rinse, spin, and dry station 340 by robotic arm 360. Robotic arm 360 lifts the wafer by its edges, out of rinse, spin and dry station 340 and places it in horizontal cassette 380 which is located in output station 350. The cassette is then transferred to storage or to another cleaning or processing system.

The megasonic bath, of the present invention, may be easily placed in line with the scrubber in FIG. 3. For example, the megasonic bath 200 (with vertical cassette) may be used in place of wet send indexer 310. The surface state of the wafers may be changed from hydrophobic to hydrophilic in the megasonic bath 200 using the same process as in the wet send indexer 310. Also the cassette 210 of the megasonic bath 200 may be raised out of the liquid medium of the megasonic bath and transferred into the outside brush station 320 using the same processes as described above with the wet send indexer 310. Thus, the present invention may be placed in line with a scrubber without the use of a robotic arm to transfer wafers, as is needed with the prior art megasonic bath in FIG. 1.

It will be clear to one with skill in the art that the present invention may be placed in line with (or incorporated into) other processing systems in a similar manner as described above with the scrubber. For example, in a chemical mechanical polisher, the receiver station in the polisher may be adapted such that the megasonic bath of the present invention may be incorporated therein. It should also be noted that it will be clear to one with skill in the art that the wafers may be held at a slight angle, for example approximately 0°–5°, instead of (or in addition to) the jets to aid in bubble removal. The reflective plate may be placed at other angles or be made of other materials such as sonic energy absorbing materials. The reflective plate may not be necessary if megasonic bath is large enough that the sonic energy dissipates before hitting the opposite wall, and the spray jets may not be necessary if alternative methods to distribute the chemicals are used.

Thus, a megasonic bath has been described. Although specific embodiments, including specific equipment, parameters, methods, and materials have been described, various modifications to the disclosed embodiments will be apparent to one of ordinary skill in the art upon reading this disclosure. Therefore, it is to be understood that such embodiments are merely illustrative of and not restrictive on the broad invention and that this invention is not limited to the specific embodiments shown and described.

What is claimed is:

1. A sonic bath comprising:
    a cassette, wherein said cassette comprises members for holding a substrate, said cassette oriented such that said members are disposed to hold said substrate in a substantially horizontal position;
    a sonic transducer; and
    a spray jet, said spray jet is positioned such that it sprays in a substantially horizontal direction and substantially in the opposite direction of said sonic energy flow, wherein said spray jet is positioned to create a fluid flow across the horizontal surfaces of said substrate such that contaminants that are removed in said sonic bath are not redeposited upon said substrate.

2. The sonic bath as described in claim 1 wherein said cassette holds a wafer in a substantially horizontal position.

3. The sonic bath as described in claim 2 wherein said sonic transducer produces a sonic energy flow in the direction of said wafer.

4. The sonic bath as described in claim 1 wherein said cassette is oriented with a tilt of approximately 0°–5°.

5. The sonic bath as described in claim 1 wherein said sonic transducer is oriented in a substantially vertical position.

6. The sonic bath as described in claim 1 wherein said sonic bath further comprises a reflective plate.

7. The sonic bath as described in claim 6 wherein said reflective plate is oriented in a substantially vertical position opposite said sonic transducer.

8. The sonic bath as described in claim 6 wherein said reflective plate is angled such that said reflective plate and the bottom of said sonic bath form an angle of approximately.

9. The sonic bath as described in claim 6 wherein said reflective plate comprises quartz.

10. A sonic bath, that has the ability to be placed directly in line with a scrubber, comprising:
    a wafer cassette, said wafer cassette oriented in a substantially vertical position, said wafer cassette holding a wafer, said wafer oriented in a substantially horizontal position;
    a sonic transducer, said sonic transducer oriented in a substantially vertical position, said sonic transducer producing a sonic energy flow in the direction of said wafers;
    a spray jet, said spray jet positioned such that it sprays in a substantially horizontal direction and substantially in the opposite direction of said sonic energy flow, wherein said spray jet is positioned to create a fluid flow across the horizontal surfaces of said wafer such that contaminants that are removed in said sonic bath are not redeposited upon said wafer; and
    a reflective plate, said reflective plate oriented in a substantially vertical position opposite said sonic transducer and angled such that said reflective plate and the bottom of said megasonic bath form an angle of 115°–135°, said reflective plate comprising quartz.

11. The sonic bath as described in claim 10 wherein said wafer cassette is oriented with a tilt of approximately 0°–5°.

12. A chemical mechanical polisher comprising:
    a sender station;
    a table; and
    a receiver, wherein said receiver comprises a sonic bath, wherein said sonic bath includes:
    a holder for a cassette, wherein said holder holds said cassette such that said cassette is oriented in a substantially vertical position said cassette holding a wafer, said wafer oriented in a substantially horizontal position;
    a sonic transducer, said sonic transducer oriented in a substantially vertical position, wherein said sonic transducer produces a sonic energy flow; and
    a spray jet wherein said spray jet is positioned to create a fluid flow across the horizontal surfaces of said wafer such that contaminants that are removed in said sonic bath are not redeposited upon said wafer.

13. The chemical mechanical polisher described in claim 12 wherein said spray jet is positioned such that it sprays in a substantially horizontal direction.

14. The chemical mechanical polisher described in claim 12 wherein said spray jet substantially horizontal the sprays in substantially the opposite direction of said sonic energy flow.

15. The chemical mechanical polisher described in claim 12 wherein said sonic bath further comprises a reflective plate.

16. The chemical mechanical polisher described in claim 15 wherein said reflective plate is angled such that said reflective plate and the bottom of said sonic bath form an angle of approximately 115°–135°.

17. A sonic bath comprising:
    a holder for a cassette, wherein said holder is disposed to hold a cassette such that said cassette is oriented in a substantially vertical position said cassette holding a wafer, said wafer oriented in a substantially horizontal position;
    a sonic transducer, said sonic transducer oriented in a substantially vertical position, wherein said sonic transducer produces a sonic energy flow; and
    a spray jet positioned to create a fluid flow across the horizontal surfaces of said wafer such that contaminants that are removed in said sonic bath are not redeposited upon said wafer.

18. The sonic bath as described in claim 17 comprising said cassette, wherein said cassette holds a substrate in a substantially horizontal position, said sonic energy flow directed towards said substrate.

19. The sonic bath as described in claim 17 where said spray jet sprays in substantially the opposite direction of said sonic energy flow.

20. A sonic bath, that has the ability to be placed directly in line with a scrubber, comprising:
    a wafer cassette, said wafer cassette oriented in a substantially vertical position, said wafer cassette holding a wafer, said wafer oriented in a substantially horizontal position;

a sonic transducer, said sonic transducer oriented in a substantially vertical position, said sonic transducer producing a sonic energy flow in the direction of said wafers;

a spray jet, said spray jet positioned such that it sprays in a substantially horizontal direction, wherein said spray jet is positioned to create a fluid flow across the horizontal surfaces of said wafer such that contaminants that are removed in said sonic bath are not redeposited upon said wafer; and a reflective plate.

21. The sonic bath as described in claim 20 wherein said wafer cassette is oriented with a tilt of approximately 0°–5°.

22. The sonic bath as described in claim 20 wherein said spray jet is positioned such that it sprays substantially in the opposite direction of said sonic energy flow.

23. The sonic bath as described in claim 20 wherein said reflective plate is oriented in a substantially vertical position opposite said sonic transducer.

24. The sonic bath as described in claim 20 wherein said reflective plate is angled such that said reflective plate and the bottom of said megasonic bath form an angle of 115°–135°.

25. The sonic bath as described in claim 20 wherein said reflective plate comprises quartz.

* * * * *